US006697387B1

(12) United States Patent
Larson

(10) Patent No.: US 6,697,387 B1
(45) Date of Patent: Feb. 24, 2004

(54) APPARATUS FOR MULTIPLEXING SIGNALS THROUGH I/O PINS

(75) Inventor: Douglas A. Larson, Lakeville, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/327,284

(22) Filed: Jun. 7, 1999

(51) Int. Cl.[7] .............................................. H04J 15/00
(52) U.S. Cl. ..................................................... 370/546
(58) Field of Search .......................... 370/546; 326/39; 712/39; 716/9; 714/35; 365/182, 189.02

(56) References Cited

U.S. PATENT DOCUMENTS

| | | | |
|---|---|---|---|
| 4,758,747 A | 7/1988 | Young et al. ................ 307/465 |
| 5,336,951 A | 8/1994 | Josephson et al. ........... 307/465 |
| 5,664,140 A | 9/1997 | Klein .......................... 711/211 |
| 5,811,987 A | * 9/1998 | Ashmore et al. .............. 326/39 |
| 5,822,610 A | * 10/1998 | Fung et al. .................... 712/39 |
| 5,953,283 A | * 9/1999 | Meltzer et al. ......... 365/189.02 |
| 6,256,767 B1 | * 7/2001 | Kuekes et al. ................... 716/9 |
| 6,502,209 B1 | * 12/2002 | Bengtsson et al. ............. 714/35 |

* cited by examiner

Primary Examiner—Salvatore Cangialosi
(74) Attorney, Agent, or Firm—Park, Vaughan & Fleming LLP

(57) ABSTRACT

One embodiment of the present invention provides an apparatus that selectively multiplexes a plurality of signal lines through an I/O pin on a semiconductor chip. This apparatus includes an I/O pin, for coupling a signal line within the semiconductor chip to a signal line outside of the semiconductor chip. A transmitting circuit is configured to selectively multiplex the plurality of signal lines onto the I/O pin. A receiving circuit is configured to receive multiplexed data from the I/O pin, and to reverse the multiplexing so that values originally from the multiplexed signal lines are separated into distinct signals in the receiving circuit. Note that the transmitting circuit and the receiving circuit are driven by a common clock signal. The apparatus additionally includes an initialization circuit that selectively configures the transmitting circuit and the receiving circuit to multiplex at least one of the plurality of signal lines through the I/O pin.

21 Claims, 6 Drawing Sheets

APPARATUS FOR MULTIPLEXING SIGNALS THROUGH I/O PINS

RELATED APPLICATION

The subject matter of this application is related to the subject matter in a co-pending non-provisional application by the same inventor(s) as the instant application and filed on the same day as the instant application entitled, "Method for Multiplexing Signals Through I/O Pins," having Ser. No. 09/327,291, and filing date Jun. 7, 1999.

BACKGROUND

1. Field of the Invention

The present invention relates to digital circuitry within a computer system. More specifically, the present invention relates to a system for multiplexing multiple signal lines through an I/O pin on a semiconductor chip.

2. Related Art

Much of the interconnection circuitry in a microprocessor-based computer system is typically aggregated in a "core logic" unit that couples the microprocessor to other parts of the computer system, such as a memory, a peripheral bus and a graphics controller.

Providing such interconnection capability can require a large number of I/O pins to accommodate all of the signal lines. Some computer systems deal with this I/O pin problem by partitioning interconnection circuitry across multiple chips. For example, a typical personal computer system includes a north bridge chip, a south bridge chip, a super I/O chip and an I/O APIC chip to support interconnections between the microprocessor and other components within the computer system. Using multiple chips is expensive because the multiple chips must be integrated together within a circuit board. This leads to additional expense in manufacturing circuit boards and maintaining inventories of each type of chip.

It is preferable to integrate all of the interconnection circuitry in a computer system into a single semiconductor chip. However, I/O pin limitations on a single chip can present problems. For example, a single core logic chip that includes all of a computer system's interconnection circuitry requires interfaces for a processor bus, a memory bus, an AGP bus for a graphics controller and a PCI bus for peripheral devices. Providing I/O pins for all of these interfaces requires many hundreds of I/O pins, especially if any of the busses support 64 bit transfers. This I/O pin requirement can easily exceed the I/O pin limitations of a single semiconductor chip.

It is desirable to somehow compress the signal lines feeding into a core logic chip so that they flow through a smaller number of I/O pins. One method of accomplishing this is to multiplex signal lines by using additional multiplexer select signals. For example, three extra select lines can be used to multiplex eight signal lines through a single I/O pin. However, these extra select signals require additional I/O pins, which somewhat defeats the purpose of the multiplexing in the first place.

What is needed is a system that multiplexes multiple signal lines through a single I/O pin without using additional I/O pins for select signals.

SUMMARY

One embodiment of the present invention provides an apparatus that selectively multiplexes a plurality of signal lines through an I/O pin on a semiconductor chip. This apparatus includes an I/O pin, for coupling a signal line within the semiconductor chip to a signal line outside of the semiconductor chip. A transmitting circuit is configured to selectively multiplex the plurality of signal lines onto the I/O pin. A receiving circuit is configured to receive multiplexed data from the I/O pin, and to reverse the multiplexing so that values originally from the multiplexed signal lines are separated into distinct signals in the receiving circuit. Note that the transmitting circuit and the receiving circuit are driven by a common clock signal. The apparatus additionally includes an initialization circuit that selectively configures the transmitting circuit and the receiving circuit to multiplex at least one of the plurality of signal lines through the I/O pin.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Core Logic Unit

Figure 1:
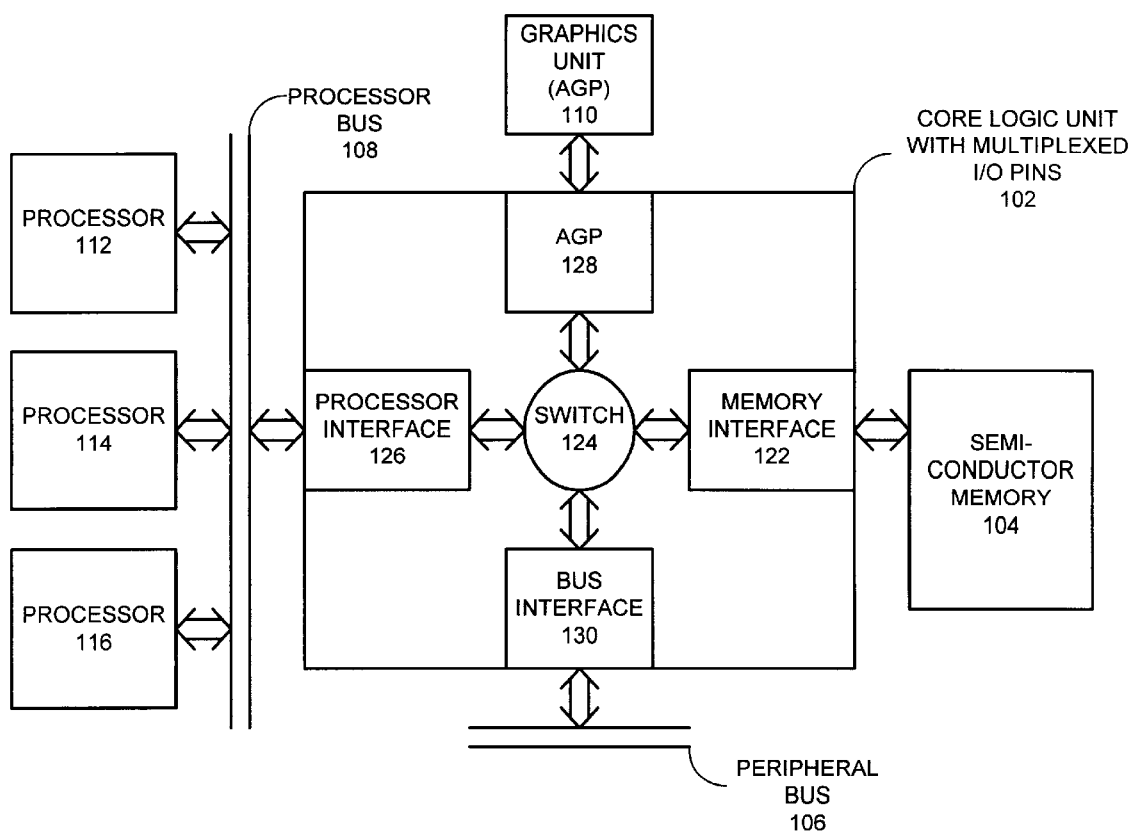
FIG. 1 illustrates a core logic unit with multiplexed I/O pins in accordance with an embodiment of the present invention.

FIG. 1 illustrates core logic unit 102 including multiplexed I/O pins in accordance with an embodiment of the present invention. The computer system illustrated in FIG. 1 includes processors 112, 114 and 116, which are coupled to processor bus 108. Processor 112, 114 and 116 may be any type of general or special purpose processors, including, but not limited to microprocessors, mainframe computers, digital signal processors, graphics processors and device controllers. Processor bus 108 may be any type of communication channel for coupling a processor to other devices in a computer system, including peripheral devices, memory devices and other processors.

Core logic unit 102 couples processor bus 108 to semiconductor memory 104, graphics unit 110 and peripheral bus 106. As illustrated in FIG. 1, core logic unit 102 contains processor interface 126 for communicating with processor bus 108, accelerated graphics port (AGP) 128 for communicating with graphics unit 110, memory interface 122 for communicating with semiconductor memory 104, and bus interface 130 for communicating with peripheral bus 106. Interfaces 126, 128, 122 and 130 are coupled together through switch 124, which can be any type. of switching circuitry that is able to selectively couple together to interfaces 126, 128, 122 and 130.

Semiconductor memory 104 can include any type of semiconductor memory for storing code and/or data for execution by processors 112, 114 and 116.

Graphics unit 110 can include any special-purpose circuitry for performing graphics operations, thereby allowing graphics computations to be off-loaded from processors 112, 114 and 116.

Peripheral bus 106 may include any type of communication channel for coupling core logic unit 102 to other devices in a computer system, including peripheral devices and memory devices. In one embodiment of the present invention, peripheral bus 106 is a PCI bus.

Transmitting Circuit and Receiving Circuit

Figure 2:
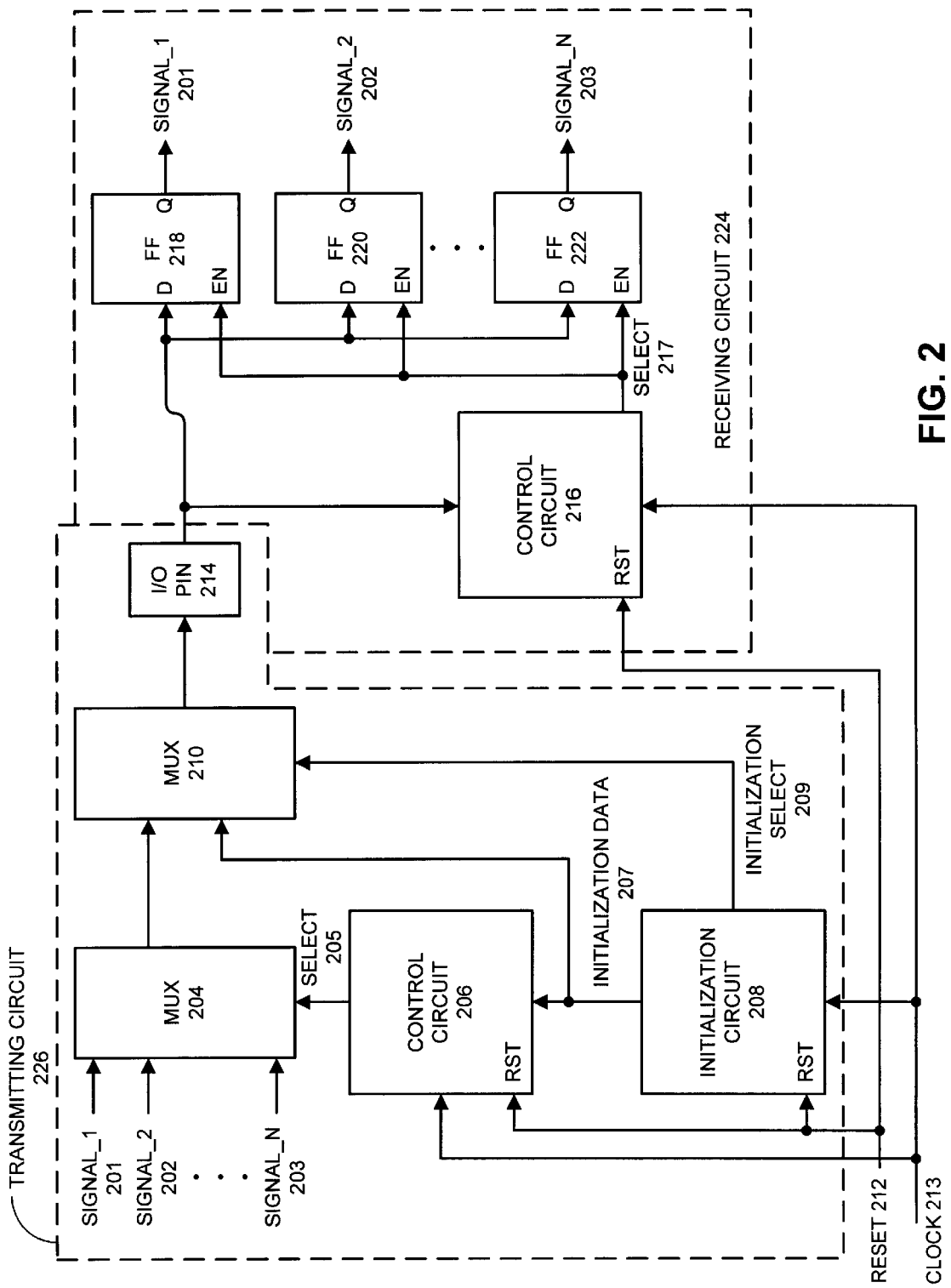
FIG. 2 illustrates a transmitting circuit coupled to a receiving circuit through an I/O pin in accordance with an embodiment of the present invention.

FIG. 2 illustrates transmitting circuit 226 coupled to receiving circuit 224 through I/O pin 214 in accordance with an embodiment of the present invention. Transmitting circuit 226 is located to the left of I/O pin 214 in FIG. 2. It includes multiplexer (MUX) 204, MUX 210, control circuit 206 and initialization circuit 208. MUX 204 selects between a number of inputs including signal_1 201, signal_2 202 and signal_N 203. One of these inputs is selected by select signal 205 from control circuit 206. This selected input becomes the output of MUX 204 which feeds into an input of MUX 210. MUX 210 takes an additional input (initialization data signal 207) and a select signal (initialization select 209) from initialization circuit 208. The output of MUX 210 feeds into I/O pin 214.

Receiving circuit 224 is generally to the right of I/O pin 214 in FIG. 2. Receiving circuit 224 includes control circuit 216 and flip-flops (FFs) 218, 220 and 222. Control circuit 216 selectively enables FFs 218, 220 and 222 to store signals 201, 202 and 203, respectively, thereby reversing the multiplexing process.

The circuit illustrated in FIG. 2 operates generally as follows. During an initialization phase, initialization circuit 208 loads initialization data signal 207 into control circuit 206 within transmitting circuit 226. Initialization circuit 208 additionally activates initialization select signal 209 to load initialization data through I/O pin 214 into control circuit 216 within receiving circuit 224. Initialization data signal 207 includes configuration information specifying which of the signals coupled to transmitting circuit 226 are to be multiplexed through I/O pin 214 into receiving circuit 224. Note that control circuits 206 and 216, as well as initialization circuit 208, are initially synchronized by an assertion of reset signal 212.

During operation, on the transmitting side control circuit 206 activates MUX 204 to selectively channel signals 201, 202 and 203 through I/O pin 214. On the receiving side, control circuit 216 selectively enables FFs 218, 220 and 222 to receive signals 201, 202 and 203, respectively, to reverse the multiplexing process. Note that control circuits 206 and 216 are driven by a common clock signal 213.

In one embodiment of the present invention, the transmitting circuit 226 is contained within a semiconductor chip (see dashed lines), while the receiving circuit 224 is located outside of the semiconductor chip. In another embodiment, receiving circuit 224 is located within a semiconductor chip (see dashed lines), while the transmitting circuit 226 is outside of the semiconductor chip. In yet another embodiment, transmitting circuit 226 is located within a first semiconductor chip and receiving circuit 224 is located within a second semiconductor chip.

ALTERNATIVE EMBODIMENT

Figure 3:
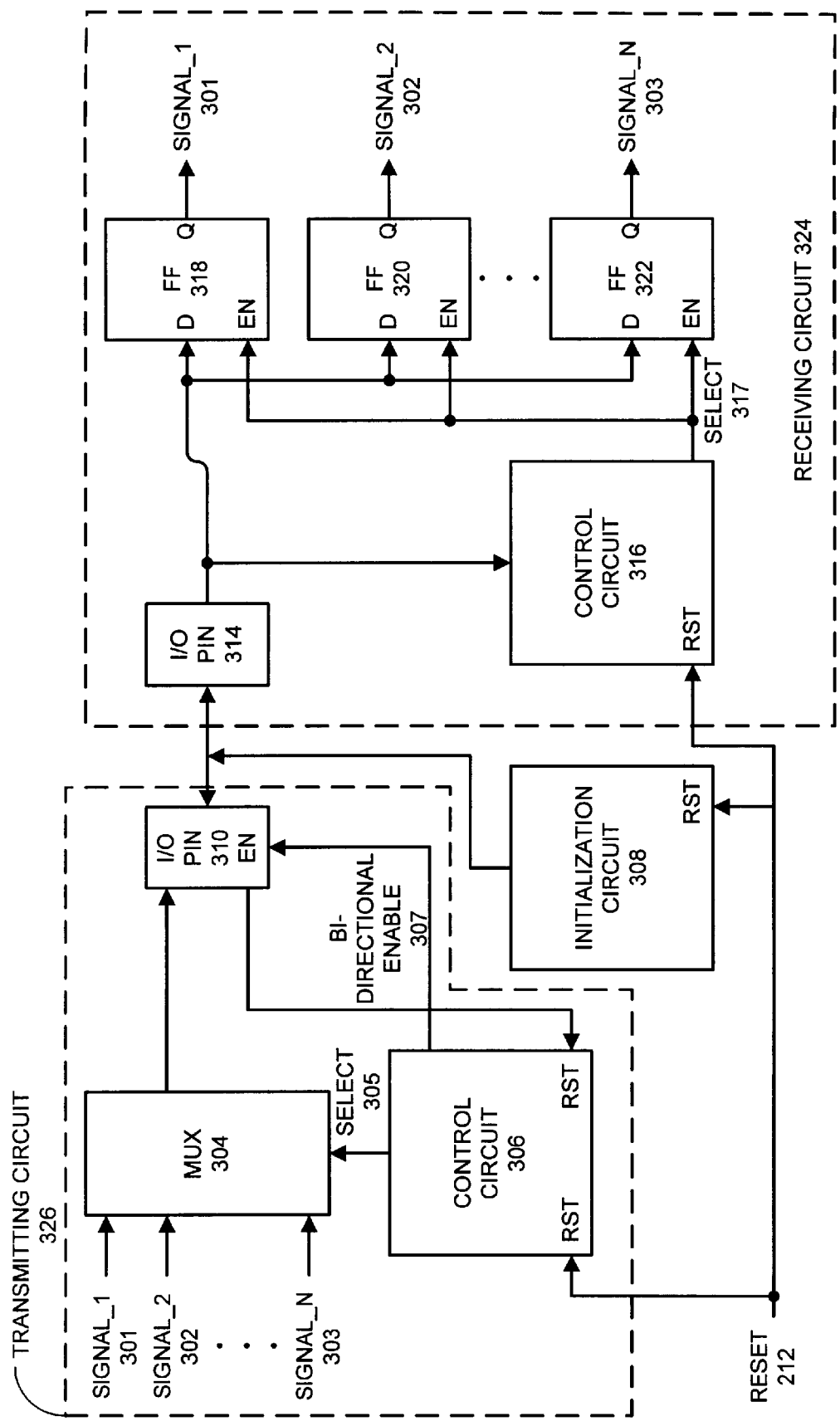
FIG. 3 illustrates a transmitting circuit coupled to a receiving circuit through an I/O pin in accordance with another embodiment of the present invention.

FIG. 3 illustrates transmitting circuit 326 coupled to receiving circuit 324 in accordance with another embodiment of the present invention. This embodiment is the same as the embodiment illustrated in FIG. 2 except that transmitting circuit 326 is located on a first semiconductor chip including I/O pin 310 (see dashed line), and receiving circuit 324 is located on a second semiconductor chip including I/O pin 314 (see dashed lines). Furthermore, initialization circuit 308 is located externally the first and second semiconductor chips. Initialization data from initialization circuit 308 feeds into control circuit 316 in receiving circuit 324 in the same manner that it does in the embodiment illustrated in FIG. 2. However, initialization data feeds through I/O pin 310 in the reverse direction into control circuit 306 within transmitting circuit 326. Note that control circuit 306 includes a bi-directional enable signal 307 that feeds into bi-directional drivers for I/O pin 310. During the initialization process, bi-directional enable signal 307 reverses the direction of the drivers so that data can be loaded from initialization circuit 308 into control circuit 306. Otherwise, the circuitry in FIG. 3 operates in substantially the same manner as the circuitry illustrated in FIG. 2.

Initialization Circuit

Figure 4:
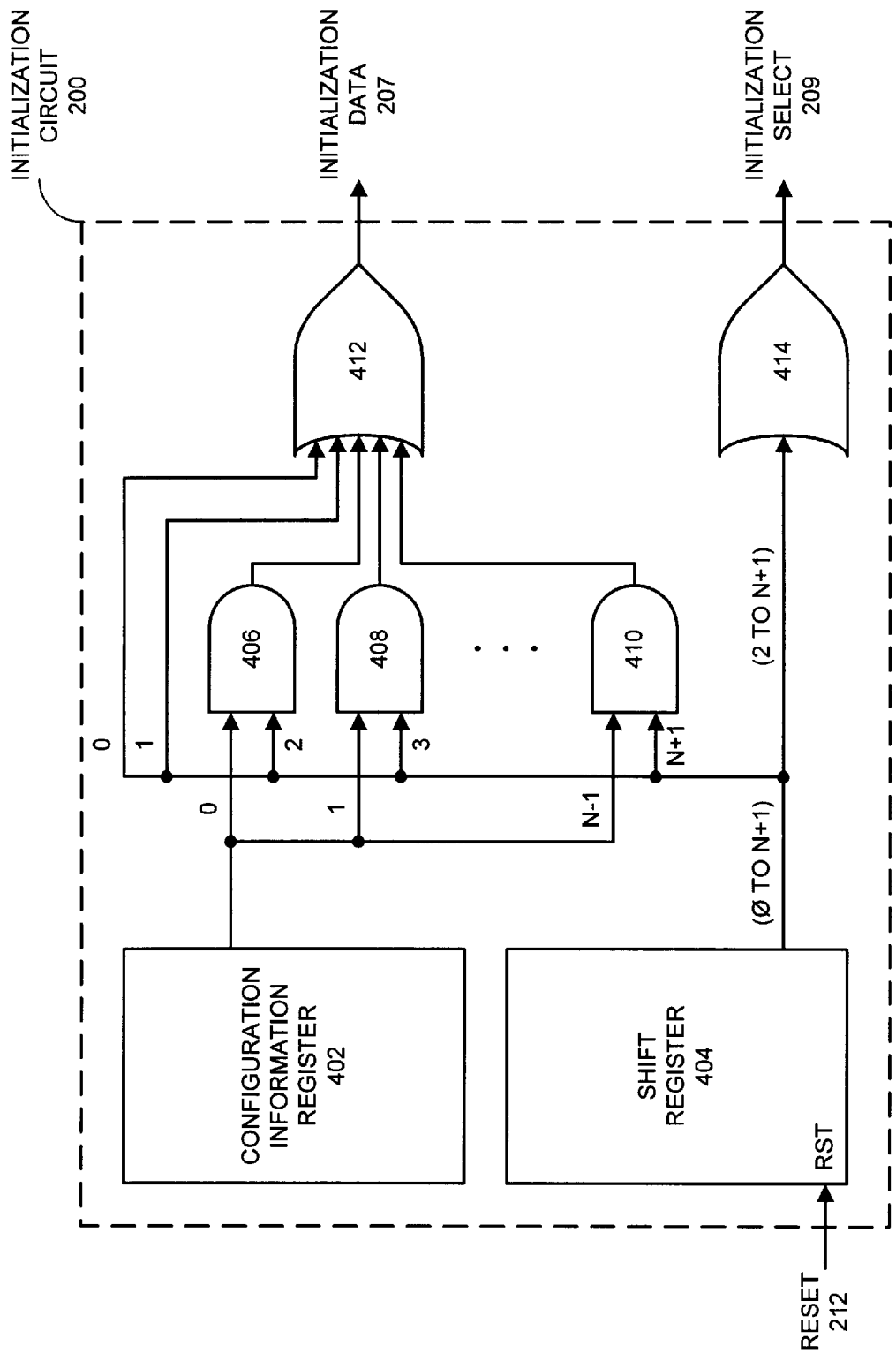
FIG. 4 illustrates the internal structure of an initialization circuit for initializing the transmitting circuit and the receiving circuit in accordance with an embodiment of the present invention.

FIG. 4 illustrates the internal structure of initialization circuit 208 for initializing transmitting circuit 226 and receiving circuit 224 in accordance with an embodiment of the present invention. Initialization circuit 208 receives reset signal 212 as an input and outputs initialization data signal 207, as well as initialization select signal 209. Bits 0 through n−1 from configuration register 402 are ANDed with bits 2 through n+1 of shift register 404. These ANDed signals are ORed together along with bits 0–1 of shift register 404 to create initialization data signal 207, which feeds configuration information into transmitting circuit 226 and receiving circuit 224 (in FIG. 2).

Signals 2 through n+1 from shift register 404 are additionally ORed together (in OR gate 414) to produce initialization select signal 209, which feeds into the control input of MUX 210 in FIG. 2.

Upon reset, shift register 404 is initialized to all zero values except for bit 0, which starts with a one value. During the initialization process, this one value shifts to ascending bit positions until it eventually shifts off the end of the shift register 404. Note that shift register 404 is two bits wider than configuration register 402. This provides two bits (or two clock cycles) to move the circuit away from the reset event, so that any asynchronous problems related to the reset event will be eliminated. Note that data from configuration register 402 will not feed through OR gate 412 until the one value in shift register 404 shifts from position 0 to position 2. Similarly, initialization select signal 209 will not be active until after two clock cycles, because the one value must shift twice from position 0 to position 2 before initialization select signal 209 is asserted. Hence, as initialization circuit 208 operates, the contents of configuration register 402 appears at the output of OR gate 412 as initialization data signal 207.

Control Circuit

Figure 5:
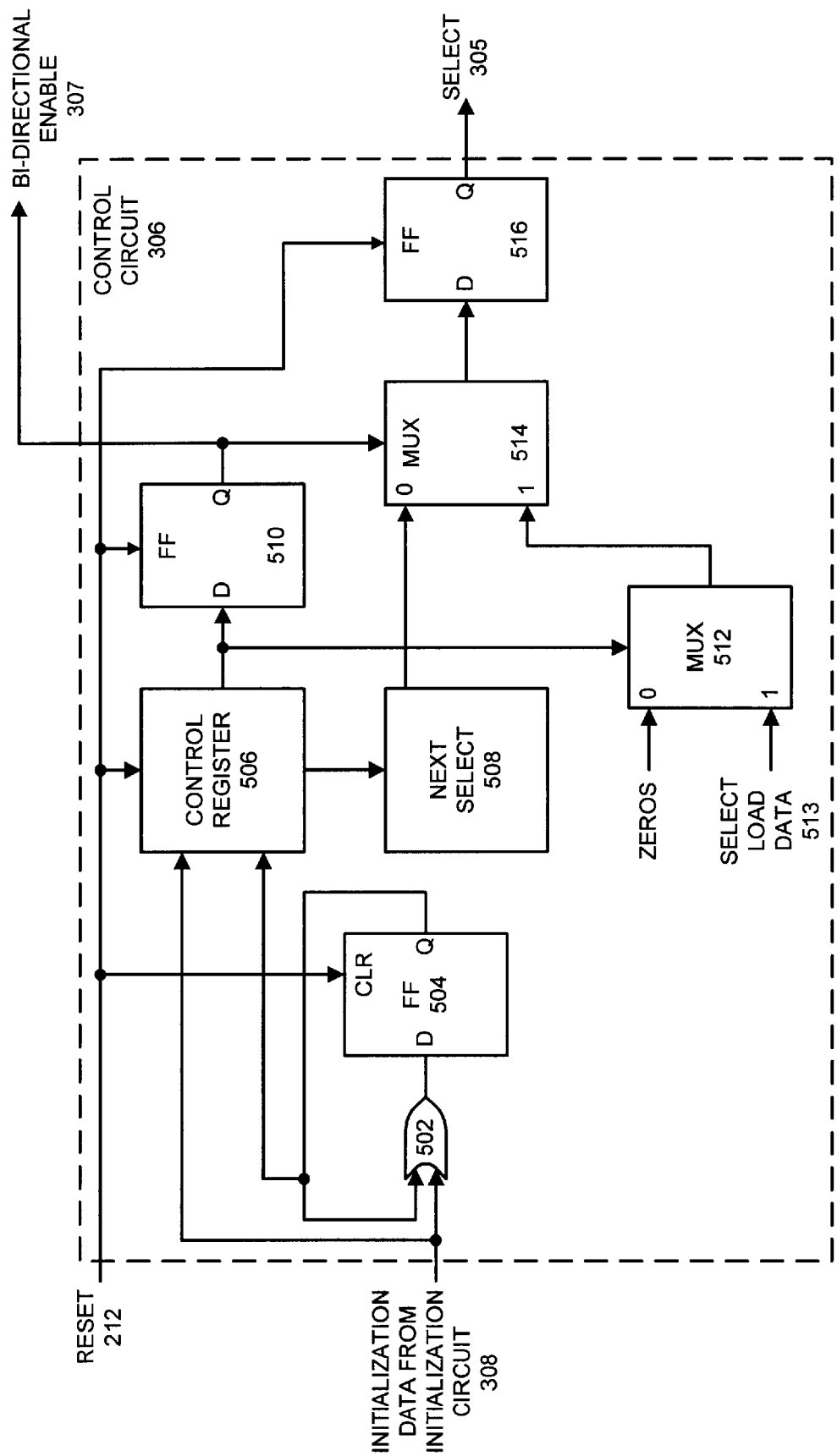
FIG. 5 illustrates the internal structure of a control circuit for controlling an initialization circuit or a receiving circuit in accordance with an embodiment of the present invention.

FIG. 5 illustrates the internal structure of control circuit 306 for controlling an initialization circuit or a receiving circuit in accordance with an embodiment of the present invention. Control circuit 306 receives inputs from initialization circuit 308 and reset signal 212. It outputs select signal 305, which is used to control MUX 304 (see FIG. 3).

Signal from initialization circuit 308 feeds through OR gate 502 into FF 504. The output of FF 504 feeds into an additional input of OR gate 502. This circuit is used to detect the two-cycle synchronization pulse that signals the start of the initialization sequence. Signal from initialization circuit 308 also feeds directly into control register 506 in order to load control register 506. Reset signal 212 feeds into both control register 506 and FFs 504, 510 and 516.

Each bit of control register 506 indicates whether or not a corresponding signal is sampled. If all bits in control register 506 have one values, all signals are sampled. When the most significant bit of control register 506 is loaded, this indicates to the system that the initialization phase is complete, and the system switches into a functional mode. One output from control register 506 feeds from the right-hand-side of control register 506, through FF 510 to become bi-directional enable signal 307. Another output feeds into next select unit 508. Next select unit 508 generates select signals that correspond to bits that are set in control register 506. These select signals are generated in rotating order. The output of next select unit 508 feeds through MUX 514 and FF 516 before becoming select signal 305. Note that FF 516 may include a plurality of flip flops, one for each select line, instead of the single flip flop as is illustrated in FIG. 5.

Select load data 513 and zeros feed into MUX 512. The output of MUX 512 feeds into an input of MUX 514. Select load data 513 is a bit pattern representing the first signal to sample. This pattern corresponds to the least significant bit that is set in control register 506.

MUXs 512 and 514 working together generate select signal 305. If bi-directional enable signal 307 is about to be set, MUXs 512 and 514 output select load data 513. If bi-directional enable signal 307 is not about to be set, MUXs 512 and 514 output all zeros. Otherwise, MUXs 512 and 514 output the select signals specified by control register 506 in rotating order.

Operation of Transmitting Circuit and Receiving Circuit

Figure 6:
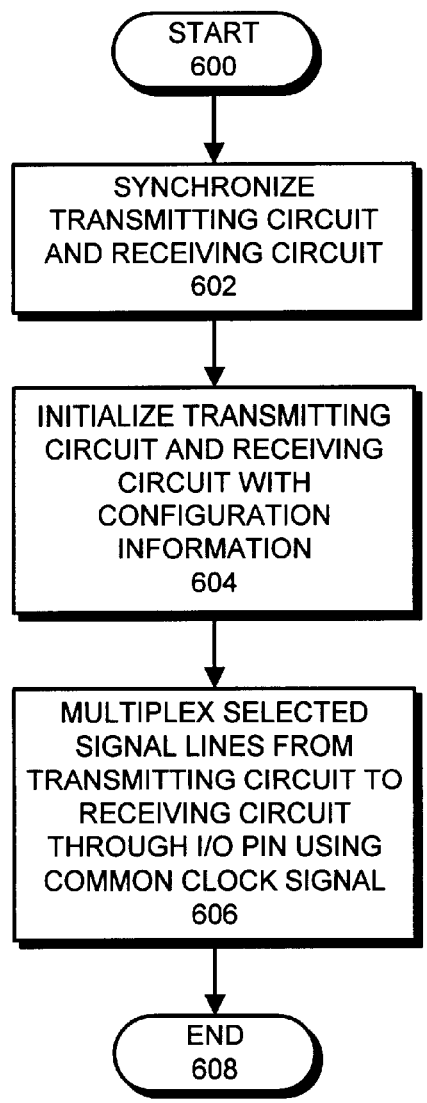
FIG. 6 is a flow chart illustrating operation of a transmitting circuit and a receiving circuit in accordance with an embodiment of the present invention.

FIG. 6 is a flow chart illustrating operation of a transmitting circuit and a receiving circuit in accordance with an embodiment of the present invention. The system starts by synchronizing transmitting circuit 226 and receiving circuit 224 (step 602). This may happen when reset signal 212 is asserted. Next, the system initializes transmitting circuit 226 and receiving circuit 224 with configuration information specifying which signal lines are to be multiplexed through I/O pin 214 (step 604). After the initialization process is complete, the system multiplexes selected signal lines from transmitting circuit 226 through I/O pin 214 into receiving circuit 224 (step 606). Note that transmitting circuit 226 and receiving circuit 224 are driven by a common clock signal so that they continue to stay synchronized with each other.

Operation of Initialization Circuit

Figure 7:
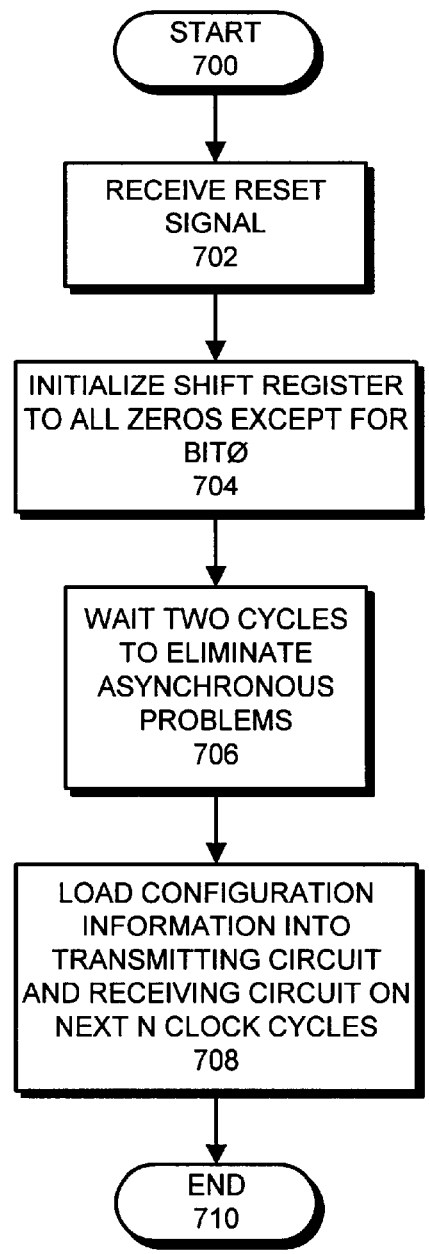
FIG. 7 is a flow chart illustrating the operation of an initialization circuit in accordance with an embodiment of the present invention.

FIG. 7 is a flow chart illustrating the operation of initialization circuit 208 in accordance with an embodiment of the present invention. Initialization circuit 208 first receives reset signal 212 (step 702). Reset signal 212 sets all bits in control register 506 to zero values except for bit 0, which is set to a one value (step 704). Initialization circuit 208 next waits two clock cycles to eliminate any potential asynchronous problems arising from assertion of reset signal 212 (step 706). Finally, initialization circuit 208 loads configuration information into transmitting circuit 226 and receiving circuit 224 during subsequent clock cycles (step 708).

The foregoing descriptions of embodiments of the invention have been presented for purposes of illustration and description only. They are not intended to be exhaustive or to limit the invention to the forms disclosed. Accordingly, many modifications and variations will be apparent to practitioners skilled in the art. Additionally, the above disclosure is not intended to limit the invention. The scope of the invention is defined by the appended claims.

What is claimed is:

1. An aparatus that selectiveliy multiplexes a plurality of signal lines through an I/O pin on a semiconductor chip without using separate pins for transmitting multiplexer selection information, comprising:

the semiconductor chip;

the I/O pin on the semiconductor chip, for coupling a signal line within the semiconductor chip to a signal line outside of the semiconductor chip;

a transmitting circuit that is configured to selectively multiplex the plurality of signal lines onto the I/O pin;

a receiving circuit that is configured to receive multiplexed data from the I/O pin, and to reverse the multiplexing so that values originally from the multiplexed signal lines are separated into distinct signals in the receiving circuit;

wherein the transmitting circuit and the receiving circuit are driven by a common clock signal coupled to both the transmitting circuit and the receiving circuit; and an initialization circuit, coupled to the transmitting circuit and the receiving circuit, that selectively configures the transmitting circuit and the receiving circuit to multiplex at least one of the plurality of signal lines and transmits the selection information through the I/O pin, which is also used for subsequent data transmission.

2. The apparatus of claim 1, further comprising a synchronizing circuit, coupled to the transmitting circuit and the receiving circuit that synchronizes the transmitting circuit and the receiving circuit by simultaneously sending a reset signal to both the transmitting circuit and the receiving circuit.

3. The apparatus of claim 1, wherein the transmitting circuit is located on the semiconductor chip and the receiving circuit is located off of the semiconductor chip.

4. The apparatus of claim 1, wherein the receiving circuit is located on the semiconductor chip and the transmitting circuit is located off of the semiconductor chip.

5. The apparatus of claim 1, wherein the semiconductor chip is a core logic chip that couples together a processor, a memory and a peripheral bus in a computer system.

6. The apparatus of claim 1, wherein the initialization circuit communicates information identifying the selected signal lines to both the transmitting circuit and the receiving circuit.

7. The apparatus of claim 1, wherein the initialization circuit is located on the semiconductor chip.

8. The apparatus of claim 1, wherein the initialization circuit is located externally to the semiconductor chip.

9. The apparatus of claim 1, wherein the I/O pin is bi-directional, and further comprising a second transmitting circuit and a second receiving circuit for communicating through the I/O pin in a reverse direction.

10. The apparatus of claim 1, wherein the initialization circuit is configured to initialize the transmitting circuit and the receiving circuit during a computer system boot up operation.

11. The apparatus of claim 1, wherein the receiving circuit includes:
   a plurality of memory elements coupled to the I/O pin for storing data values received from the I/O pin; and
   a control circuit that selectively enables the plurality of memory elements so as to record data values from signal lines in corresponding memory elements.

12. The apparatus of claim 1, wherein the transmitting circuit includes:
   a multiplexer for multiplexing the plurality of signal lines onto the I/O pin; and
   a control circuit that controls the multiplexer so that the at least one of the plurality of signal lines is multiplexed onto the I/O pin.

13. An apparatus that selectively multiplexes a plurality of signal lines through an I/O pin on a semiconductor chip without using separate pins for transmitting multiplexer selection information, wherein the semiconductor chip is a core logic chip that couples together a processor, a memory and a peripheral bus in a computer system, the apparatus comprising:
   the semiconductor chip;
   the I/O pin on the semiconductor chip, for coupling a signal line within the semiconductor chip to a signal line outside of the semiconductor chip;
   a transmitting circuit that is configured to selectively multiplex the plurality of signal lines onto the I/O pin;
   a receiving circuit that is configured to receive multiplexed data from the I/O pin, and to reverse the multiplexing so the multiplexed data is separated into distinct signals in the receiving circuit;
   wherein the transmitting circuit and the receiving circuit are driven by a common clock signal coupled to both the transmitting circuit and the receiving circuit;
   an initialization circuit, coupled to the transmitting circuit and the receiving circuit, that selectively configures the transmitting circuit and the receiving circuit to multiplex at least one selected signal line from the plurality of signal lines and transmits the selection information through the I/O pin, which is also used for subsequent data transmission;
   wherein the initialization circuit communicates information identifying the at least one selected signal line to both the transmitting circuit and the receiving circuit;
   wherein the initialization circuit is configured to initialize the transmitting circuit and the receiving circuit during a computer system boot up operation; and
   a synchronizing circuit, coupled to the transmitting circuit and the receiving circuit, that synchronizes the transmitting circuit and the receiving circuit by simultaneously sending a reset signal to both the transmitting circuit and the receiving circuit.

14. The apparatus of claim 13, wherein the receiving circuit includes:
   a plurality of memory elements coupled to the I/O pin for storing data values received from the I/O pin; and
   a control circuit that selectively enables the plurality of memory elements so as to record data values from the at least one selected signal line into corresponding memory elements.

15. The apparatus of claim 13, wherein the transmitting circuit includes:
   a multiplexer for multiplexing the plurality of signal lines onto the I/O pin; and
   a control circuit that controls the multiplexer so that the at least one selected signal line is multiplexed onto the I/O pin.

16. The apparatus of claim 13, wherein the receiving circuit is located on the semiconductor chip and the transmitting circuit is located off of the semiconductor chip.

17. The apparatus of claim 13, wherein the initialization circuit is located on the semiconductor chip.

18. The apparatus of claim 13, wherein the initialization circuit is located externally to the semiconductor chip.

19. An computer system that selectively multiplexes a plurality of signal lines through an I/O pin without using separate pins for transmitting multiplexer selection information, comprising:
   a processor;
   a memory;
   a semiconductor chip within the computer system containing circuitry for performing computer system operations;
   the I/O pin on the semiconductor chip, for coupling a signal line within the semiconductor chip to a signal line outside of the semiconductor chip;
   a transmitting circuit that is configured to selectively multiplex the plurality of signal lines onto the I/O pin;
   a receiving circuit that is configured to receive multiplexed data from the I/O pin, and to reverse the multiplexing so that values originally from the multiplexed signal lines are separated into distinct signals in the receiving circuit;
   wherein the transmitting circuit and the receiving circuit are driven by a common clock signal coupled to both the transmitting circuit and the receiving circuit; and
   an initialization circuit, coupled to the transmitting circuit and the receiving circuit, that selectively configures the transmitting circuit and the receiving circuit to multiplex at least one of the plurality of signal lines and transmits the selection information through the I/O pin, which is also used for subsequent data transmission.

20. The computer system of claim 19, wherein the receiving circuit includes:
   a plurality of memory elements coupled to the I/O pin for storing data values received from the I/O pin; and
   a control circuit that selectively enables the plurality of memory elements so as to record data values from the at least one selected signal line into corresponding memory elements.

21. The computer system of claim 19, wherein the transmitting circuit includes:
   a multiplexer for multiplexing the plurality of signal lines onto the I/O pin; and
   a control circuit that controls the multiplexer so that the at least one selected signal line is multiplexed onto the I/O pin.

* * * * *